(12) United States Patent
Wang

(10) Patent No.: US 8,016,559 B2
(45) Date of Patent: Sep. 13, 2011

(54) COOLING FAN

(75) Inventor: Cheng-Chien Wang, Taichung Hsien (TW)

(73) Assignee: Tek-Chain Technology Co., Ltd., Taoyuan (TW)

( * ) Notice: Subject to any disclaimer, the term of this patent is extended or adjusted under 35 U.S.C. 154(b) by 734 days.

(21) Appl. No.: 12/216,659

(22) Filed: Jul. 9, 2008

(65) Prior Publication Data
US 2010/0006271 A1 Jan. 14, 2010

(51) Int. Cl.
*F04D 29/056* (2006.01)

(52) U.S. Cl. .......................... 415/229; 416/174; 361/695

(58) Field of Classification Search .................. 415/229; 416/174
See application file for complete search history.

(56) References Cited

U.S. PATENT DOCUMENTS

| | | | | |
|---|---|---|---|---|
| 5,441,386 | A | * | 8/1995 | Hsieh .............................. 415/230 |
| 6,183,221 | B1 | * | 2/2001 | Hsieh ........................ 417/423.12 |
| 2008/0008590 | A1 | * | 1/2008 | Yeh et al. ....................... 416/174 |
| 2008/0292479 | A1 | * | 11/2008 | Lin et al. ..................... 417/423.7 |

* cited by examiner

*Primary Examiner* — Stephen W Smoot
(74) *Attorney, Agent, or Firm* — Chun-Ming Shih; HDLS IPR Services

(57) ABSTRACT

A cooling fan includes a stator formed of an outer sleeve and an inner sleeve that suspends in the outer sleeve and has a middle part fixedly connected to a middle part of the outer sleeve and a plurality of crevices equiangularly spaced around the top end thereof, a hollow axle bearing inserted into the inner sleeve of the stator and having top and bottom hook blocks respectively hooked on the top and bottom ends of the outer sleeve of the stator and a plurality of crevices equiangularly spaced around the bottom end, a steel ball rotatably supported inside the axle bearing, and a fan blade that has a center axle inserted into the axle bearing and stopped against the steel ball.

4 Claims, 7 Drawing Sheets

COOLING FAN

BACKGROUND OF THE INVENTION

1. Field of the Invention

The present invention relates to cooling fan and more particularly, to an improved structure of cooling fan that eliminates installation clearance to minimize friction and hard strength, avoiding operation noise and improving fan performance.

2. Description of the Related Art

A typical cooling fan for computer or the like, as shown in FIG. 1, generally comprises a bracket 1, a stator 11 affixed to the bracket 1, a winding 12 wound on the stator 11, a magnetic device 13 arranged around the winding 12, a bearing 14 mounted in the stator 11, an axle 151 coupled to the bearing 14, and a fan blade 15 affixed to the axle 151 for synchronous rotation. When electricity is provided to the winding 12, the winding 12 is energized to induce a magnetic field that acts upon the magnetic device 13, causing rotation of the fan blade 15 with the axle 151. According to this design, the bearing 14 is press-fitted into the stator 11, friction and hard strength are produced during rotation of the fan blade 15, resulting in a high noise level.

Therefore, it is desirable to provide a cooling fan that runs smoothly without producing much noise.

SUMMARY OF THE INVENTION

The present invention has been accomplished under the circumstances in view. It is one object of the present invention to provide a cooling fan, which eliminates installation clearance to minimize friction and hard strength, avoiding operation noise and improving fan performance.

To achieve these and other objects of the present invention, the cooling fan comprises a bracket, a stator, an axle bearing, a steel ball and a fan blade. The stator is fixedly mounted in the bracket, comprising an outer sleeve and an inner sleeve concentrically suspending inside the outer sleeve. The inner sleeve has a middle part fixedly connected to a middle part of the outer sleeve and a plurality of crevices equiangularly spaced around the periphery of the top end thereof. The axle bearing is a tubular member inserted into the inner sleeve of the stator, having a top open end, a bottom close end opposite to said top open end, a plurality of top hook blocks and bottom hook blocks protruded from the periphery and respectively spaced around the top open end and the bottom close end and respectively hooked on top and bottom ends of the outer sleeve of the stator, a bottom center through hole cut through the center of said bottom close end, and a plurality of crevices radially extending from the bottom center through hole. The steel ball is rotatably supported on the bottom close end inside the axle bearing. The fan blade has a center axle inserted into the axle bearing and stopped against the steel ball. Further, each top hook block has an outer wall sloping downwardly outwards, and each bottom hook block has an outer wall sloping upwardly outwards. Further, the crevices of the axle bearing divide the bottom close end into a plurality of equiangularly spaced springy strips that surround the steel ball. Further, the inner sleeve of the stator comprises a first annular inside flange and a second annular inside flange respectively extending around top and bottom ends of the inside wall thereof for the hooking of the top hook blocks and the bottom hook blocks of the axle bearing.

DETAILED DESCRIPTION OF THE PREFERRED EMBODIMENT

Figure 1:
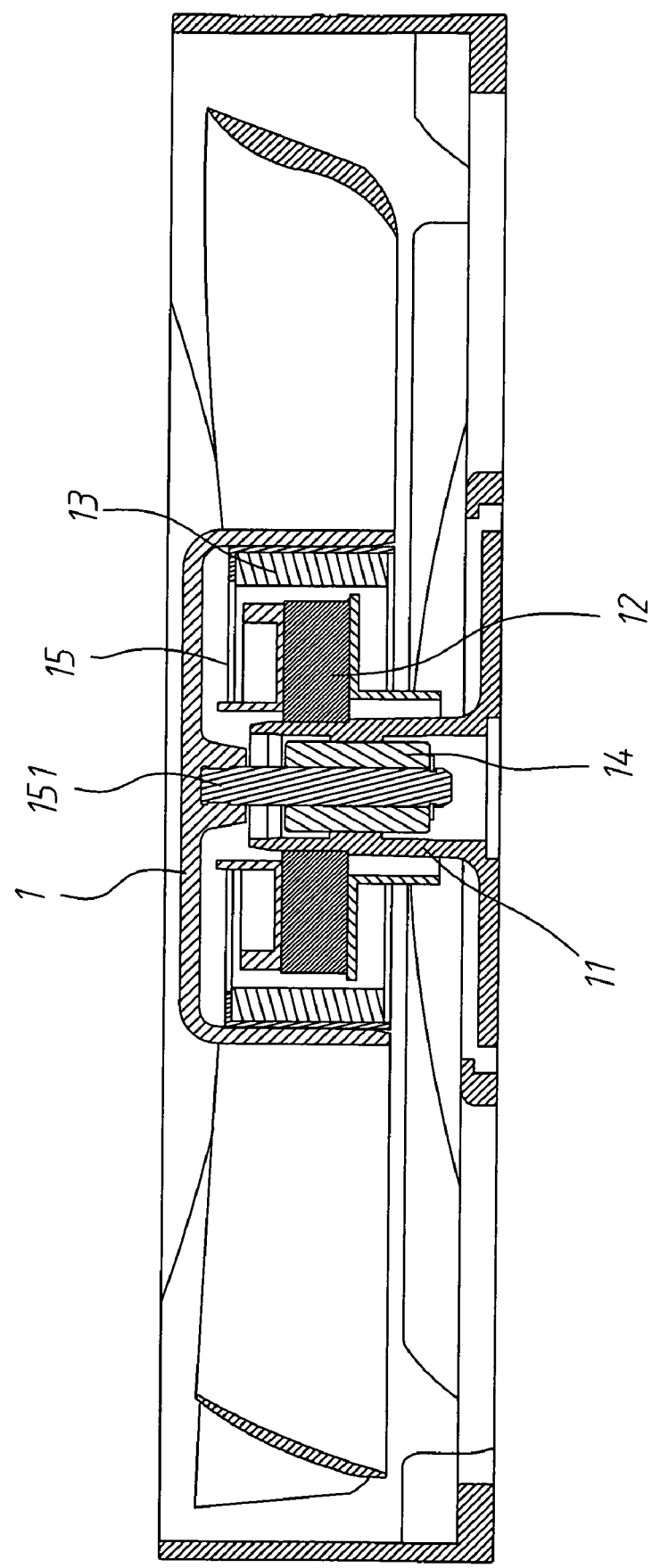
FIG. 1 is a sectional view of a typical conventional cooling fan.
Figure 2:
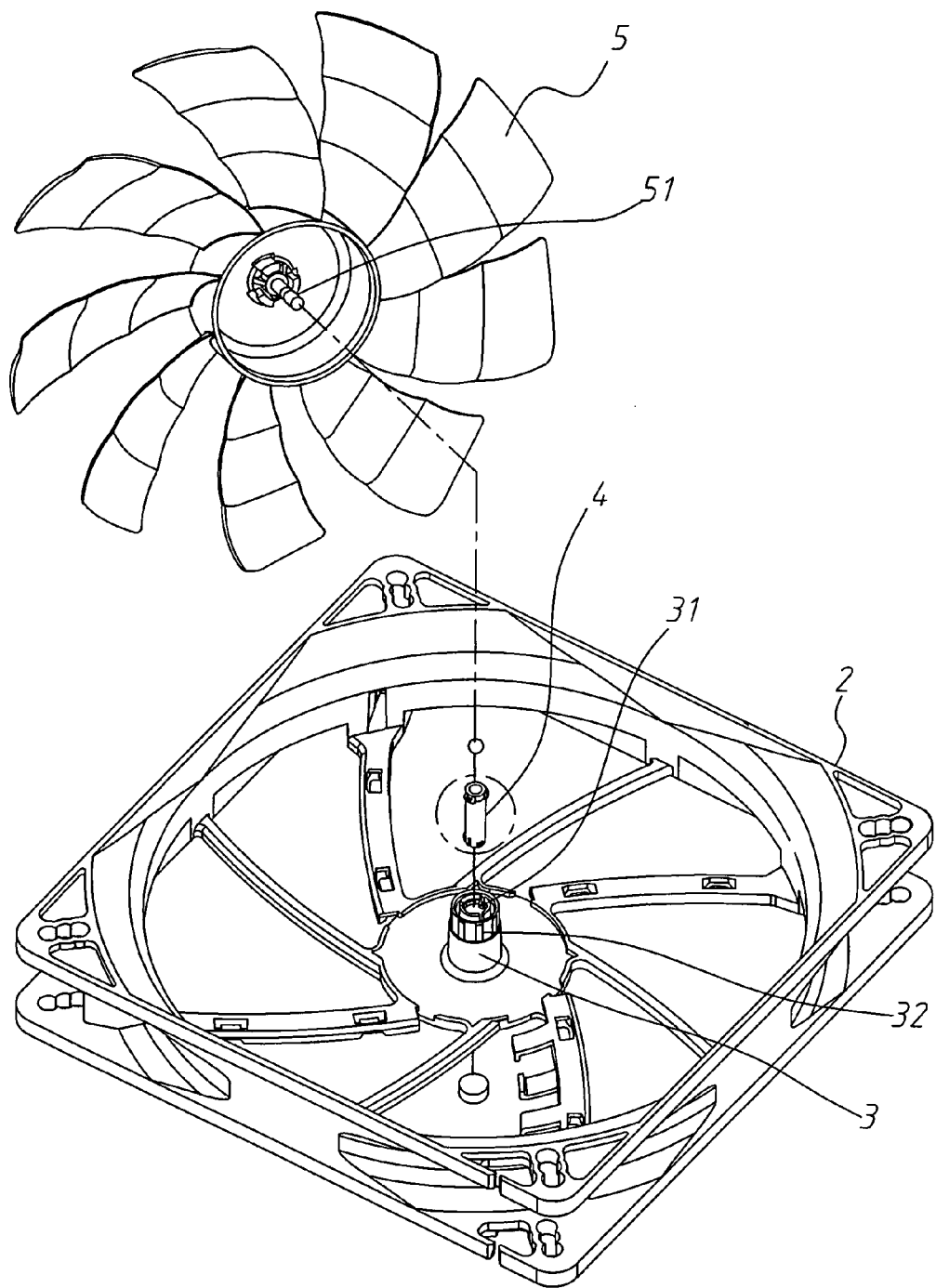
FIG. 2 is an exploded view of a cooling fan in accordance with the present invention.
Figure 3A:
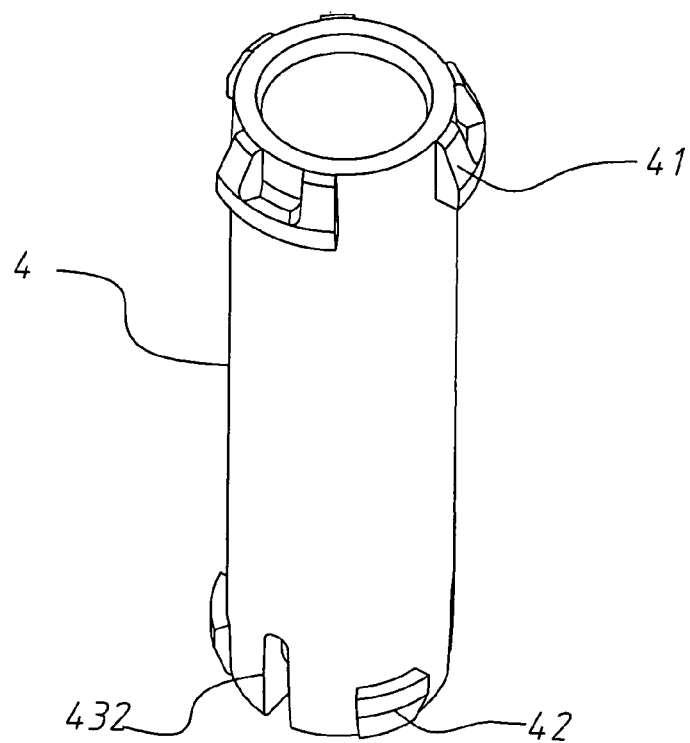
FIG. 3A is an elevational view of the axle bearing according to the present invention.
Figure 3B:
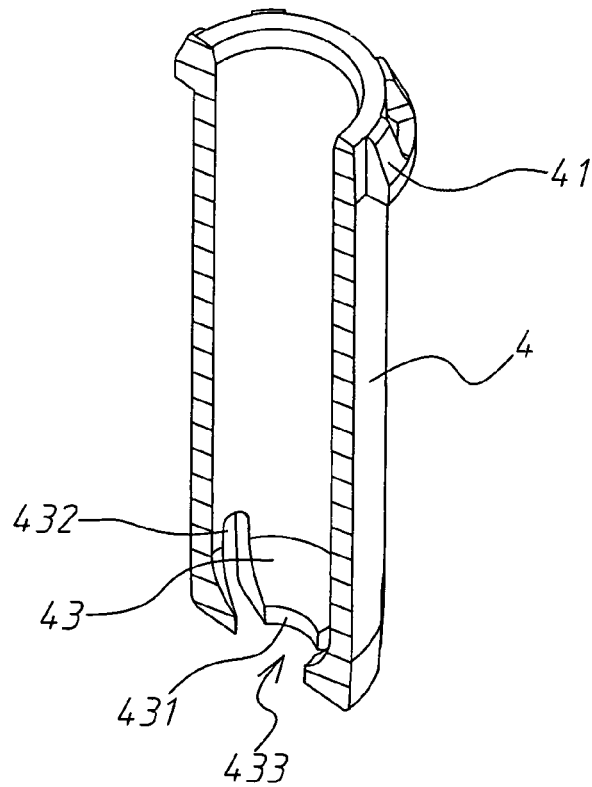
FIG. 3B is a sectional elevation of the axle bearing according to the present invention.
Figure 4:
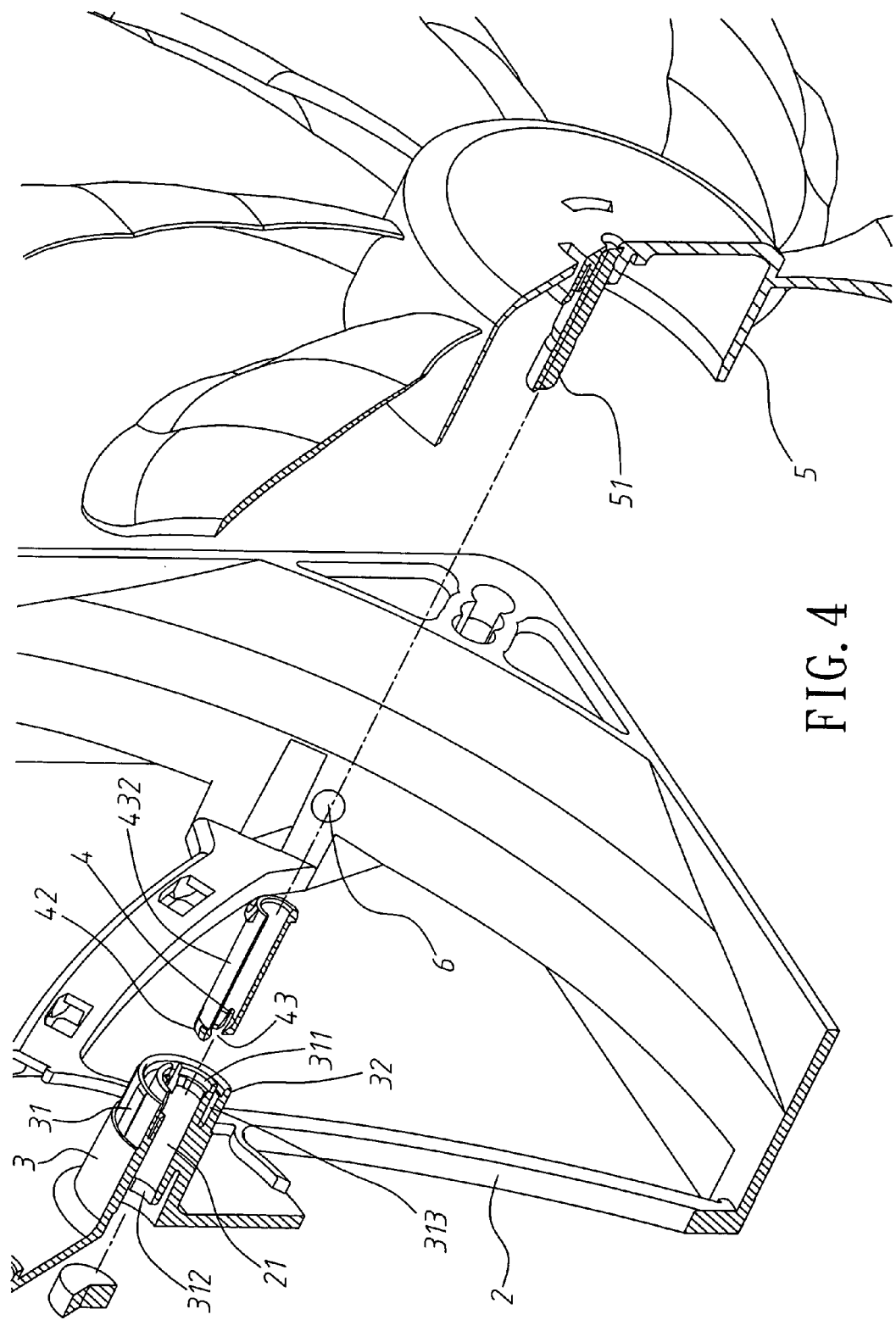
FIG. 4 is an exploded view in sectional elevation of the cooling fan according to the present invention.

Referring to FIGS. 2~4, a cooling fan in accordance with the present invention is shown comprised of a bracket 2, a stator 3, an axle bearing 4, and a fan blade 5. The stator 3 is fixedly mounted in the bracket 2, comprised of an inner sleeve 31 and an outer sleeve 32. The inner sleeve 31 is concentrically disposed inside the outer sleeve 32 with a middle part of the outside wall thereof fixedly connected to a middle part of the inside wall of the outer sleeve 32. The inner sleeve 31 has a first annular inside flange 311 and a second annular inside flange 312 respectively extending around top and bottom ends of the inside wall thereof, and a plurality of longitudinal crevices 313 cut through the top end and the first annular inside flange 311 and equiangularly spaced around the periphery.

The axle bearing 4 is a tubular bearing having a plurality of first hook blocks 41 protruded from the periphery and equiangularly spaced around one end, namely, the top end, a plurality of second hook blocks 42 protruded from the periphery and equiangularly spaced around the other end, namely, the bottom end, a bottom wall 43 blocking the bottom end, a bottom center through hole 431 cut through the center of the bottom wall 43, and a plurality of crevices 432 radially extending from the bottom center through hole 431 to the periphery of the bottom end and then longitudinally extending upwards. The crevices 432 divide the bottom end and bottom wall 43 of the axle bearing 4 into multiple springy strips 433. Further, each first hook block 41 has an outer wall sloping downwardly outwards. Further, each second hook block 42 has an outer wall sloping upwardly outwards.

Figure 5:
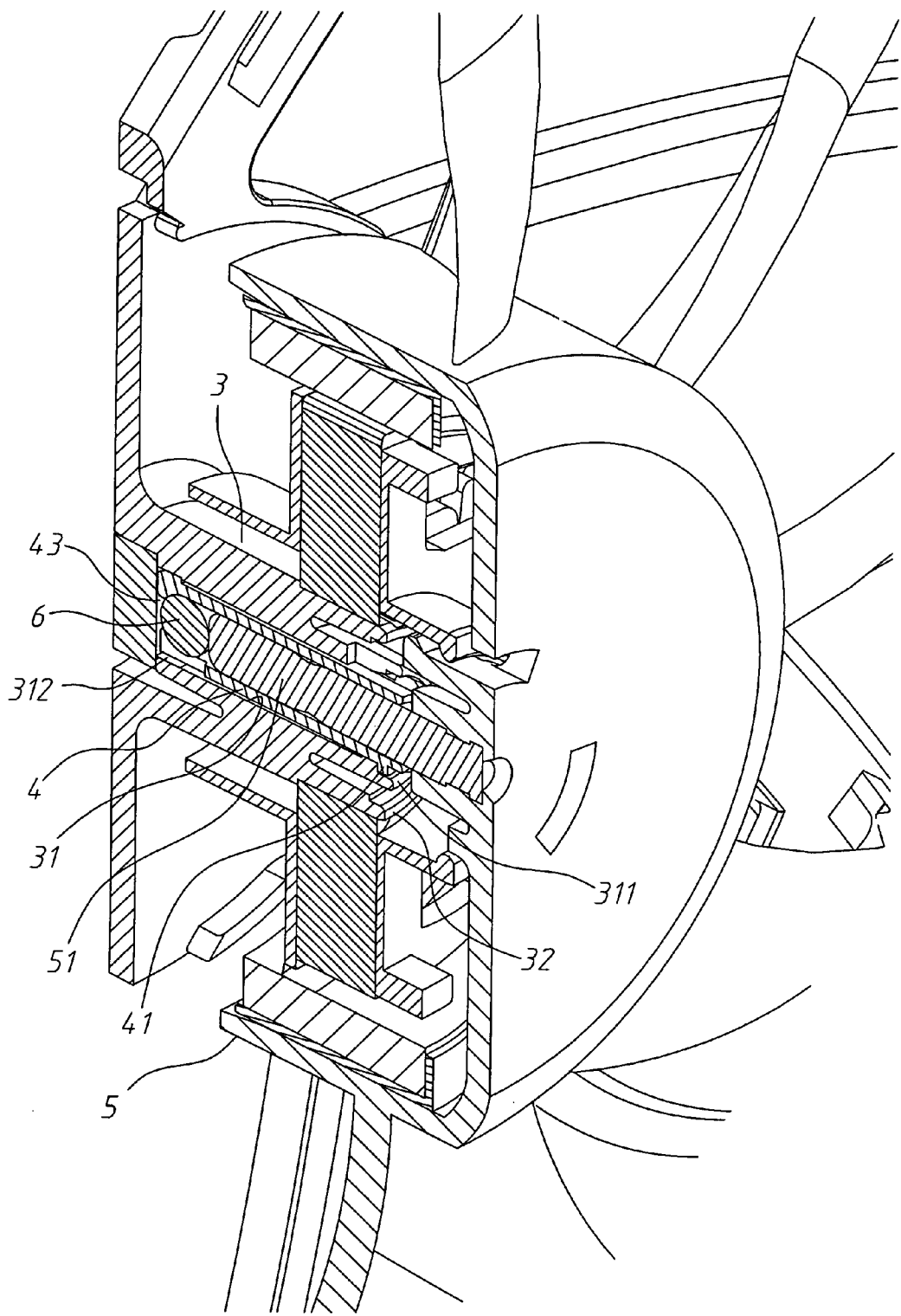
FIG. 5 is a sectional elevation of the present invention, showing the cooling fan assembled.

During installation, as shown in FIG. 5, a steel ball 6 is inserted into the axle bearing 4, and then the axle bearing 4 is inserted into the inner sleeve 31 of the stator 3 in the bracket 2 to force the first hook blocks 41 and second hook blocks 42 of the axle bearing 4 into engagement with the first annular inside flange 311 and second annular inside flange 312 of the inner sleeve 31 of the stator 3 respectively, and then the axle 51 of the fan blade 5 is inserted into the axle bearing 4 and stopped against the steel ball 6. By means of the effect of the longitudinal crevices 313 of the inner sleeve 31 of the stator 3 and the crevices 432 of the axle bearing 4, the invention eliminates installation clearance, lowering friction and hard strength, and therefore avoiding noise during rotation of the fan blade.

Referring to FIG. 5 again, the springy strips 433 of the axle bearing 4 surround the steel ball 6, eliminating installation clearance. When the axle bearing 4 is been inserted into the inner sleeve 31 of the stator 3 in the bracket 2 to force the first and hook blocks 41 and 42 into engagement with the first and second annular inside flanges 311 and 312 of the inner sleeve 31 of the stator 3, excessive air pressure is expelled out of the axle bearing 4 through the crevices 432 of the axle bearing 4, allowing smooth rotation of the fan blade 5. Further, the longitudinal crevices 313 of the inner sleeve 31 of the stator 3 allows the stator 3 to expand and to shrink subject to variation of temperature, assuring positive contact with the axle bearing 4 and eliminating installation clearance, and therefore friction and hard strength are minimized, and no significant noise will be produced during rotation of the fan blade.

Figure 6:
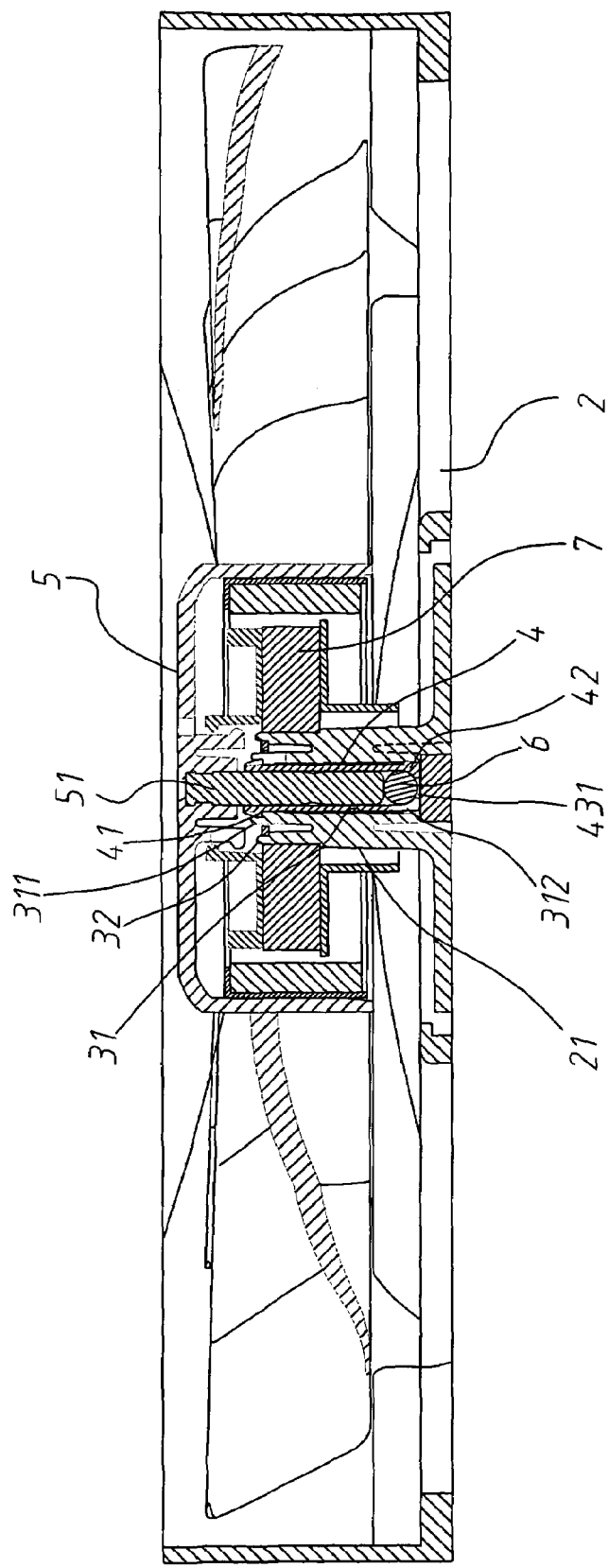
FIG. 6 is a sectional plain view of the present invention, showing the cooling fan assembled.

Referring to FIG. 6, as stated above, the inner sleeve 31 of the stator 3 is concentrically disposed inside the outer sleeve 32 and a middle part of the outside wall of the inner sleeve 31 is fixedly connected to a middle part of the inside wall of the outer sleeve 32, i.e., the upper part and lower part of the inner sleeve 31 are respectively kept apart of the inside wall of the outer sleeve 32 by a gap. When winding the winding 7 on the stator 3, the compression force from the winding 7 is prohibited from being transferred to the axle 51 of the fan blade 5, and therefore the axle 51 of the fan blade 5 will not be jammed in the stator 3.

Figure 7:
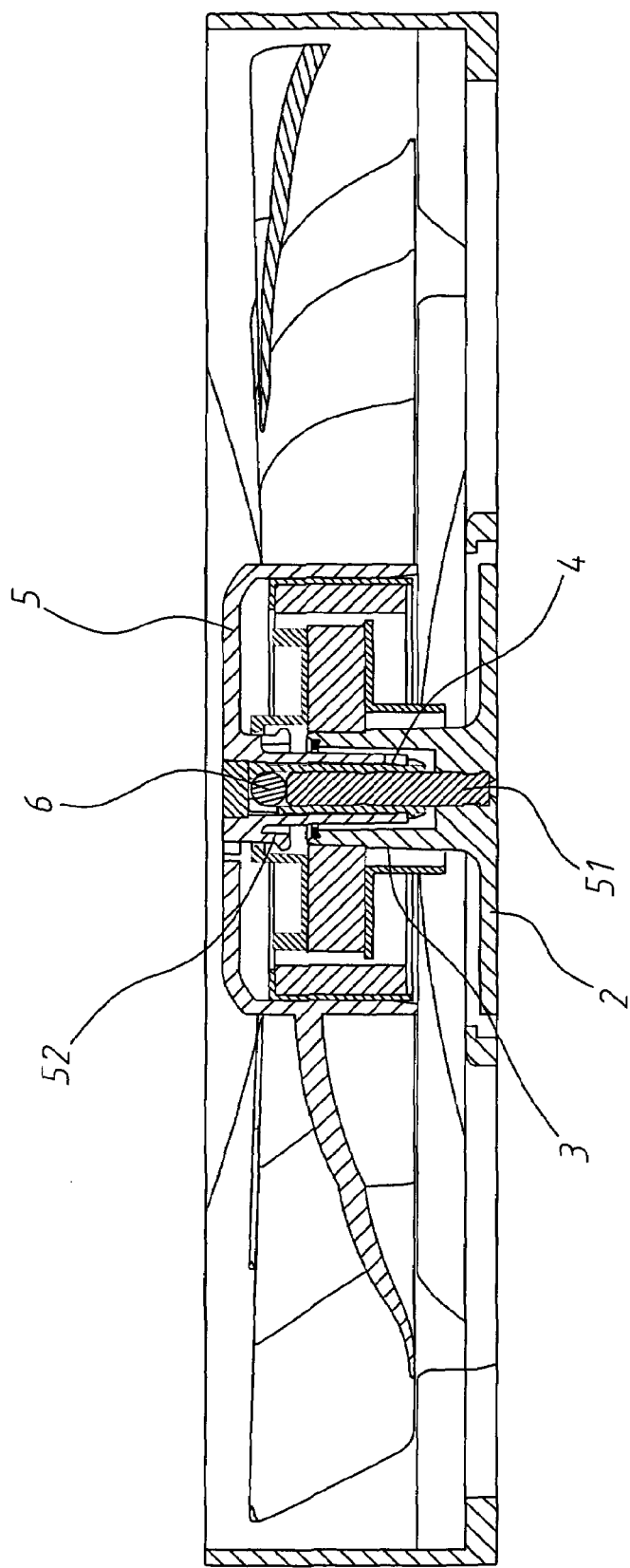
FIG. 7 is a sectional plain view of an alternate form of the present invention.

FIG. 7 illustrates an alternate form of the present invention. According to this embodiment, the fan blade 5 has a hub 52 that accommodates the axle bearing 4. The axle bearing 4 holds the steel ball 6 on the inside. The axle 51 is mounted in the axle bearing 4, having one end stopped at the steel ball 6 against the hub 52 of the fan blade 5 and the other end fastened to the stator 3 in the bracket 2. This embodiment achieves the same effects.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A cooling fan, comprising:
a bracket;
a stator fixedly mounted in said bracket, said stator comprising an outer sleeve and an inner sleeve concentrically suspending inside said outer sleeve, said inner sleeve having a middle part fixedly connected to a middle part of said outer sleeve and a plurality of crevices equiangularly spaced around the periphery of a top end thereof;
an axle bearing inserted into said inner sleeve of said stator, said axle bearing being a tubular member having a top open end, a bottom close end opposite to said top open end, a plurality of top hook blocks and bottom hook blocks protruded from the periphery and respectively spaced around said top open end and said bottom close end and respectively hooked on top and bottom ends of said outer sleeve of said stator, a bottom center through hole cut through the center of said bottom close end, and a plurality of crevices radially extending from said bottom center through hole;
a steel ball rotatably supported on said bottom close end inside said axle bearing; and
a fan blade, said fan blade having a center axle inserted into said axle bearing and stopped against said steel ball.

2. The cooling fan as claimed in claim 1, wherein each said top hook block has an outer wall sloping downwardly outwards; each said bottom hook block has an outer wall sloping upwardly outwards.

3. The cooling fan as claimed in claim 1, wherein the crevices of said axle bearing divide said bottom close end into a plurality of equiangularly spaced springy strips that surround said steel ball.

4. The cooling fan as claimed in claim 1, wherein said inner sleeve of said stator comprises a first annular inside flange and a second annular inside flange respectively extending around top and bottom ends of an inside wall thereof for the hooking of said top hook blocks and said bottom hook blocks of said axle bearing.

* * * * *